(12) United States Patent
Goda et al.

(10) Patent No.: US 7,292,476 B2
(45) Date of Patent: Nov. 6, 2007

(54) PROGRAMMING METHOD FOR NAND EEPROM

(75) Inventors: Akira Goda, Boise, ID (US); Seiichi Aritome, Boise, ID (US); Todd Marquart, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 170 days.

(21) Appl. No.: 11/215,933

(22) Filed: Aug. 31, 2005

(65) Prior Publication Data

US 2007/0047314 A1   Mar. 1, 2007

(51) Int. Cl.
G11C 16/04 (2006.01)

(52) U.S. Cl. .............. 365/185.17; 365/185.27

(58) Field of Classification Search ........... 365/185.17, 365/185.27, 185.28
See application file for complete search history.

(56) References Cited

U.S. PATENT DOCUMENTS

| | | | |
|---|---|---|---|
| 5,257,225 A | 10/1993 | Lee | |
| 5,357,463 A | 10/1994 | Kinney | |
| 5,424,993 A | 6/1995 | Lee et al. | |
| 5,680,350 A | 10/1997 | Lee | |
| 5,768,287 A | 6/1998 | Norman et al. | |
| 5,771,346 A | 6/1998 | Norman et al. | |
| 5,907,855 A | 5/1999 | Norman | |
| 5,930,168 A | 7/1999 | Roohparvar | |
| 6,163,048 A * | 12/2000 | Hirose et al. | 257/315 |
| 6,240,023 B1 | 5/2001 | Roohparvar | |
| 6,487,117 B1 * | 11/2002 | Choi et al. | 365/185.17 |
| 6,493,270 B2 | 12/2002 | Chevallier | |
| 6,522,584 B1 | 2/2003 | Chen et al. | |
| 6,661,707 B2 * | 12/2003 | Choi et al. | 365/185.17 |
| 6,925,011 B2 | 8/2005 | Pekny et al. | |
| 2004/0237000 A1 | 11/2004 | Keays | |

OTHER PUBLICATIONS

S. Satoh et al., A Novel Gate-Offset NAND Cell (GOC-NAND) Technology Suitable for High-Density and Low-Voltage-Operation Flash Memories, Microelectronics Engineering Laboratory, Japan, IEEE, 1999, 4 pgs.

S. Satoh et al., A Novel Isolation-Scaling Technology for NAND EEPROMs with the Minimized Program Disturbance, Microelectronics Engineering Laboratory, Japan, IEEE, 1997, IEDM 97-291, pp. 11.6.1-11.6.4.

* cited by examiner

Primary Examiner—Vu A. Le
(74) Attorney, Agent, or Firm—Leffert Jay & Polglaze, P.A.

(57) ABSTRACT

A NAND architecture non-volatile memory device and programming process is described that programs the various cells of strings of non-volatile memory cells by the application of differing word line pass voltages (Vpass) to the unselected word lines of the memory cell string or array during an programming cycle. In one embodiment of the present invention, the differing word line pass voltages (Vpass) are utilized depending on the placement of the memory cell in the NAND memory cell string. In another embodiment of the present invention, the differing word line pass voltages (Vpass) are utilized to compensate for faster and slower programming word lines/memory cells.

51 Claims, 8 Drawing Sheets $Vch\_boost = f(Vpass, Vt\_other\ WLs)$

PROGRAMMING METHOD FOR NAND EEPROM

TECHNICAL FIELD OF THE INVENTION

The present invention relates generally to memory devices and in particular the present invention relates to EEPROM and Flash memory devices.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. Memory devices that do not lose the data content of their memory cells when power is removed are generally referred to as non-volatile memories. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. A typical floating gate memory cell is fabricated in an integrated circuit substrate and includes a source region and a drain region that is spaced apart from the source region to form an intermediate channel region. A conductive floating gate, typically made of doped polysilicon, or non-conductive charge trapping layer (a floating node), such as nitride (as would be utilized in a silicon-oxide-nitride-oxide-silicon or SONOS gate-insulator stack), is disposed over the channel region and is electrically isolated from the other cell elements by a dielectric material, typically an oxide. For example, a tunnel oxide that is formed between the floating gate/node and the channel region. A control gate is located over the floating gate/node and is typically made of doped polysilicon or metal. The control gate is electrically separated from the floating gate/node by another dielectric layer. Thus, the floating gate or charge trapping layer/floating node is "floating" in dielectric so that it is insulated from both the channel and the control gate. Charge is transported to or removed from the floating gate or trapping layer by specialized programming and erase operations, respectively, altering the threshold voltage of the device.

Yet another type of non-volatile memory is a Flash memory. A typical Flash memory comprises a memory array, which includes a large number of memory cells. Each of the memory cells includes a floating gate or charge trapping layer embedded in a field effect transistor (FET) transistor. The cells are usually grouped into sections called "erase blocks." Each of the cells within an erase block can be electrically programmed by tunneling charges to its individual floating gate/node. Unlike programming operations, however, erase operations in Flash memories typically erase the memory cells in bulk erase operations, wherein all floating gate/node memory cells in a selected erase block are erased in a single operation. It is noted that in recent Flash memory devices multiple bits have been stored in a single cell by utilizing multiple threshold levels or a non-conductive charge trapping layer with the storing of data trapped in a charge near each of the sources/drains of the memory cell FET.

An EEPROM or Flash NAND array architecture arranges its array of non-volatile memory cells in a matrix of rows and columns, as a conventional NOR array does, so that the gates of each non-volatile memory cell of the array are coupled by rows to word lines (WLs). However, unlike NOR, each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity.

A problem in programming NAND architecture Flash memory devices is that the non-volatile memory cells coupled to the different word lines of a given NAND memory string can have faster or slower programming characteristics dependent on their position in the memory string and the channel generated in the cells of the memory string by a pass voltage (Vpass) that is applied to them to operate them as pass transistors during programming. In addition the other memory cells of the string and those of adjacent memory strings of the erase block can be subject to higher program disturb (where the stored data is corrupted by charge being inadvertently tunneled into or out of the memory cell due to program operations nearby) likelihood due to the position of the selected word line in the memory string and the level of Vpass utilized to drive the unselected memory cells of the memory string.

For the reasons stated above, and for other reasons stated below which will become apparent to those skilled in the art upon reading and understanding the present specification, there is a need in the art for alternative methods of programming NAND architecture Flash memory arrays.

SUMMARY

The above-mentioned problems with programming NAND architecture Flash memories and other problems are addressed by the present invention and will be understood by reading and studying the following specification.

The various embodiments relate to non-volatile memory devices wherein differing word line pass voltages (Vpass) are utilized in the programming of non-volatile memory cells (such as floating gate or floating node/charge trapping memory cells) of NAND architecture EEPROM and Flash memory arrays, where the level of Vpass utilized is selected based on the position of the memory cell selected to be programmed in the memory string. In one embodiment of the present invention, the differing word line pass voltages (Vpass) are utilized depending on the placement of the memory cell being programmed in the NAND memory cell string. In another embodiment of the present invention, the differing word line pass voltages (Vpass) are utilized at the same time to compensate for faster and slower programming word lines/memory cells. In another embodiment, different word line pass voltages (Vpass) are applied to the string based on physical aspects of the word lines of the array, including, but not limited to, an interlaced array of alternating wide/thin cross section word lines which have higher/lower word line resistances and/or capacitive coupling ratios with the underlying non-volatile memory cells.

For one embodiment, the invention provides a method of programming memory cells of a NAND architecture memory string comprising selecting a memory cell of a NAND architecture memory string of a non-volatile memory array, and selecting and applying a pass voltage to a gate of one or more unselected memory cells of the string based on the position of the selected memory cell in the NAND architecture memory string.

In another embodiment, the invention provides a non-volatile NAND architecture memory device comprising a NAND architecture non-volatile memory array having a plurality of memory blocks and a control circuit. The control circuit is adapted to program memory cells in a selected memory block of the non-volatile memory array by, selecting a memory cell in one or more NAND architecture memory cell strings for programming in a selected block of non-volatile memory cells, where the selected memory cell in each of the one or more memory cell strings is coupled to a word line, applying a program voltage to the word line coupled to the selected memory cells, and selecting and applying a pass voltage to one or more unselected word lines coupled to one or more unselected memory cells of the one or more memory cell strings based on the position of the selected memory cells and word line in the one or more NAND architecture memory strings.

Further embodiments of the invention include methods and apparatus of varying scope.

DETAILED DESCRIPTION

Figure 1:
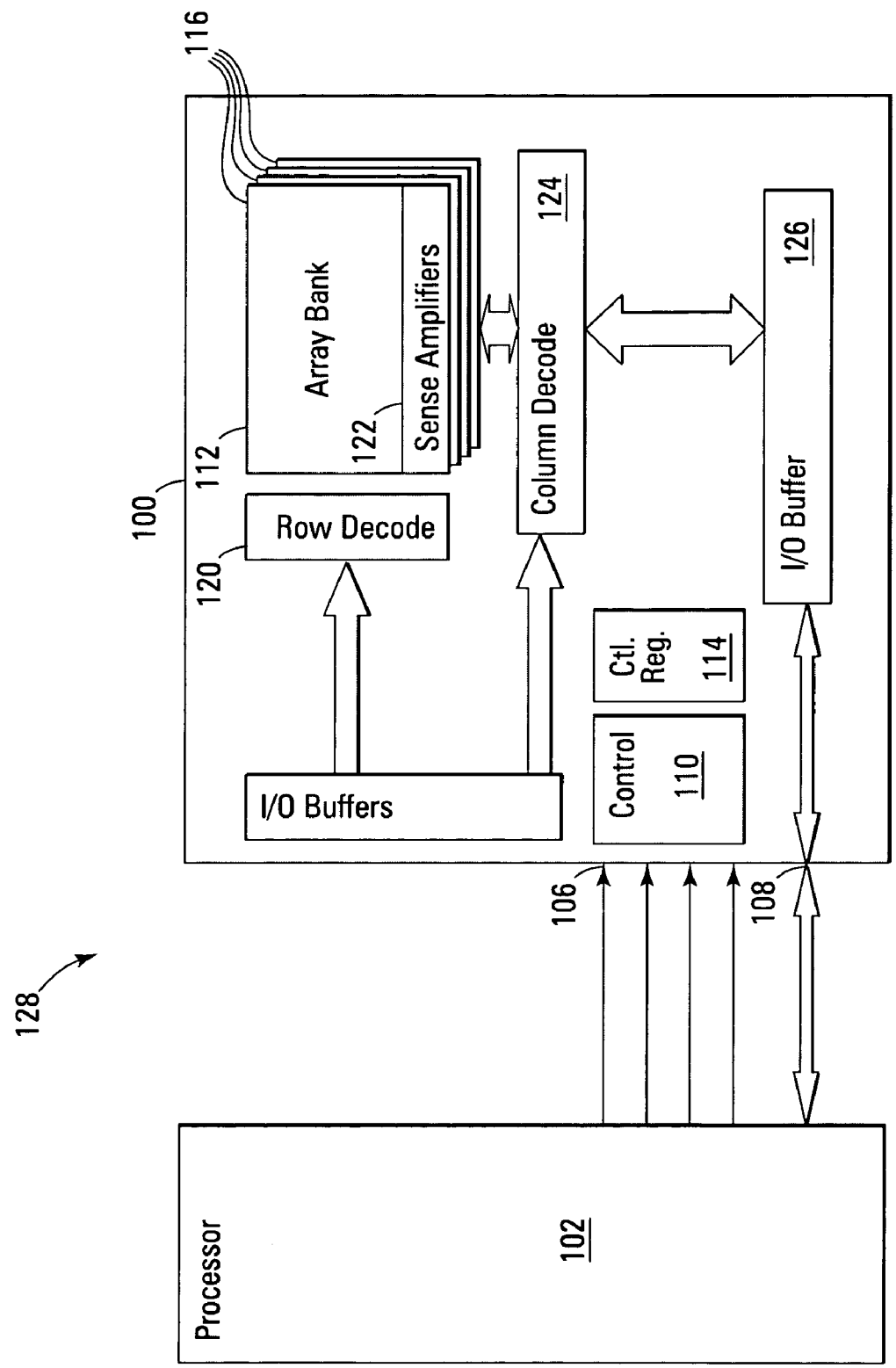
FIG. 1 is a simplified block diagram of a system containing a non-volatile memory device in accordance with an embodiment of the present invention.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the claims.

Embodiments of the present invention include NAND architecture non-volatile memory devices and arrays that program the various cells of strings of non-volatile memory cells by the application of differing word line pass voltages (Vpass) to the unselected word lines of the memory cell string or array during an programming cycle. This facilitates a faster on average program operation, an increase in memory device endurance and lifetimes due to a decrease in memory cell overstress, and a more accurate match of word line pass voltages to the specific memory cell being programmed in the NAND memory string or NAND non-volatile memory array. In one embodiment of the present invention, the differing word line pass voltages (Vpass) are utilized depending on the placement of the memory cell being programmed in the NAND memory cell string. In another embodiment of the present invention, the differing word line pass voltages (Vpass) are utilized to compensate for faster and slower programming word lines/memory cells. In another embodiment, different word line pass voltages (Vpass) are applied based on physical aspects of the word lines of the array, including, but not limited to, an interlaced array of alternating wide/thin cross section word lines which have higher/lower word line resistances and/or capacitive coupling ratios with the underlying non-volatile memory cells. It is noted that embodiments of the present invention include all non-volatile memory cell devices and memories that trap charge in an electrically isolated region (such as charge trapping/floating node memory cells) and are not limited to floating gate memory cell arrays or memory devices.

FIG. 1 details a simplified diagram of a system 128 incorporating a non-volatile memory device 100 of an embodiment of the present invention connected to a host 102, which is typically a processing device or memory controller. The non-volatile memory 100, such as a Flash memory device, has a control interface 106 and an address/data interface 108 that are each connected to the processing device 102 to allow memory read and write accesses. It is noted that in alternative embodiments, the address/data interface 108 can be divided into separate interfaces. Internal to the non-volatile memory device a control state machine/control circuit 110 directs the internal operation; managing the non-volatile memory array 112 and updating RAM control registers and erase block management registers 114. The RAM control registers and tables 114 are utilized by the control state machine 110 during operation of the non-volatile memory 100. The non-volatile memory array 112 contains a sequence of memory banks or segments 116, each bank 116 is organized logically into a series of erase blocks (not shown). Memory access addresses are received on the address/data interface 108 of the non-volatile memory 100 and divided into a row and column address portions. On a read access the row address is latched and decoded by row decode circuit 120, which selects and activates a row page (not shown) of memory cells and the other memory cells in their associated strings across a selected memory bank. The bit values encoded in the output of the selected row of memory cells are connected from a local bitline/string (not shown) to a global bitline (not shown) and detected by sense amplifiers 122 associated with the memory bank. The sense amplifiers 122 also typically include a data cache and write data latch circuits (not shown). The column address of the access is latched and decoded by the column decode circuit 124. The output of the column decode circuit selects the desired column data from the sense amplifier outputs and connected to the data buffer 126 for transfer from the memory device through the address/data interface 108. On a write access the row decode circuit 120 selects the row page and column decode circuit selects write sense amplifiers 122. Data values to be written are connected from the data buffer 126 to the data cache and then to the write data latches of the write sense amplifiers 122 selected by the column decode circuit 124 and written to the selected non-volatile memory cells (not shown) of the memory array 112. The written cells are then reselected by the row and column decode circuits 120, 124 and sense amplifiers 122 so that they can be read to verify that the correct values have been programmed into the selected memory cells. It is noted that in one embodiment of the present invention, the column decode 124 may be optionally placed between the memory array 112 and the sense amplifiers 122.

As stated above, two common types of non-volatile or Flash memory array architectures are the "NAND" and "NOR" architectures, so called for the resemblance which the basic memory cell configuration of each architecture has to a basic NAND or NOR gate circuit, respectively. In the NOR array architecture, the memory cells of the memory array are arranged in a matrix similar to conventional RAM or ROM. The gates of each non-volatile memory cell of the array matrix are coupled by rows to word select lines (word lines or WL) and their drains are coupled to column bit lines (BL). The source of each memory cell is typically coupled to a common source line (SL). The NOR architecture floating gate or floating node/charge trapping memory array is accessed by a row decoder activating a row of memory cells by selecting the word line coupled to their gates. The row of selected memory cells then place their stored data values on the column bit lines by flowing a differing current from the coupled source line to the coupled column bit lines depending on their programmed states. A column page of bit lines is selected and sensed, and individual data words are selected from the sensed data words from the column page and communicated from the memory.

A NAND memory array architecture also arranges its array of non-volatile memory cells in a matrix such that the gates of each memory cell of the array are coupled by rows to word lines. However each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity.

Figure 2:
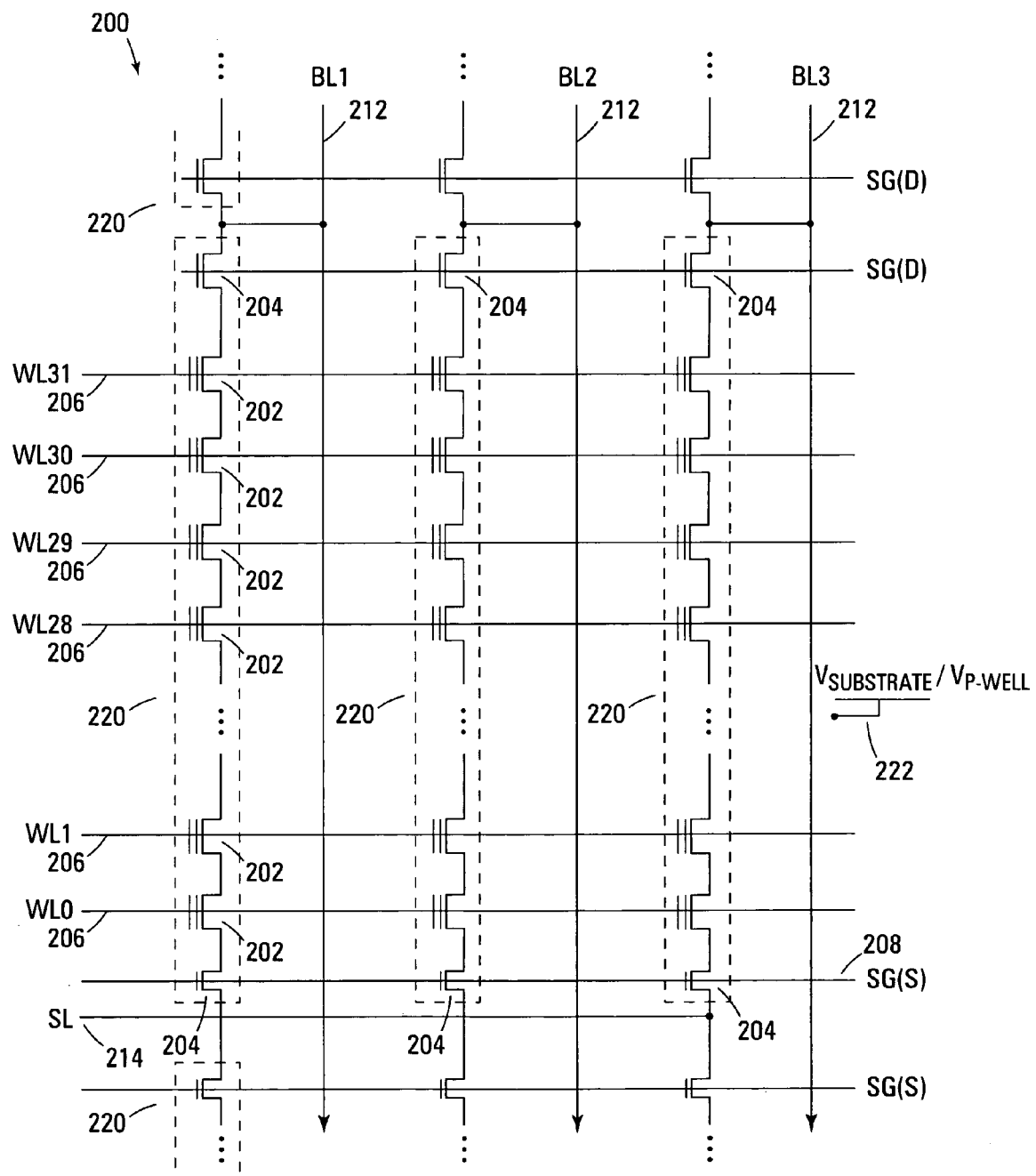
FIG. 2 is a simplified block diagram of a NAND architecture Flash memory array in accordance with an embodiment of the present invention.

FIG. 2 shows a schematic of a simplified NAND architecture floating node or trapping layer memory array 200 of a NAND Flash memory device of an embodiment of the present invention. It is noted that the memory array 200 of FIG. 2 is for illustrative purposes and should not be taken as limiting and that other NAND memory array embodiments of the present invention are possible and will be apparent to those skilled in the art with the benefit of the present disclosure. In FIG. 2, a series of NAND memory strings 220 are arranged in an array 200 and coupled to bit lines 212 and source lines 214. In each NAND memory string 220, a series of floating gate or floating node memory cells 202 of embodiments of the present invention are coupled together source to drain to form the NAND string 220 (typically having 8, 16, 32, or more cells). As described above, each floating gate/node memory cell FET 202 has a gate-insulator stack formed over the channel region. To further enable operation, in one embodiment of the present invention, each NAND architecture memory string 220 of the memory is formed in an isolation trench, allowing the substrate of each isolation trench to be individually biased for programming and erasure. The word lines 206 couple across the NAND strings 220, coupling the control gates of adjacent memory cells 202 enabling a single memory cell 202 in each memory string 220 to be selected. In each NAND memory string 220, impurity (N+ typically) doped regions are formed between each gate insulator stack to form the source and drain regions of the adjacent memory cells 202, which additionally operate as connectors to couple the cells of the NAND string 220 together. In one embodiment of the present invention, the N+ doped regions are omitted and a single channel region is formed under the NAND memory string 220, coupling the individual memory cells 202. Each NAND memory string 220 is coupled to select gates 204 that are formed at either end of each NAND string 220 and selectively couple opposite ends of each NAND string 220 to a bit line 212 and a source line 214. The select gates 204 are each coupled to gate select lines, select gate drain {SG(D)} 210 and select gate source {SG(S)} 208, that control the coupling of the NAND strings to the bit lines 212 and source lines 214, respectively, through the select gates 204. In FIG. 2, the substrate connection 222 is shown coupled to each NAND string 220, allowing the memory cells 202 of each NAND string 220 to be biased from the substrate.

A NAND architecture floating gate or floating node memory array is accessed by a row decoder activating a row of memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate/node memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the memory device.

Common programming technique for Flash/EEPROM memories programs a bit or row (commonly referred to as a page) of the memory by applying a programming voltage or series of programming voltage pulses to the control gates of the selected memory cells and programming or inhibiting the selected memory cells to either program (set at logical "0" by the injection of charge to the floating gate or floating node of a memory cell) or inhibit (not program, usually intended to leave the cell erased and set at logical "1") by coupling their channels to either a program or inhibit voltage.

As stated above, in programming operations in NAND architecture Flash/EEPROM memory arrays, a programming voltage is coupled to a word line coupled to the gate of the selected memory cell of a memory string. In addition, the word lines coupled to the gates of the unselected memory cells of each string are also driven by a pass gate voltage (Vpass) so as to operate them as pass transistors, generating a channel of carriers by capacitive coupling in the unselected memory cells and allowing them to pass current in a manner that is relatively unrestricted by their stored data values. The memory string is then typically coupled to a bit line or source line that has a program voltage place upon it. As stated above, the applied pass voltage, Vpass, also allows generation of a channel of carriers in the memory string and allows the memory cell that was selected for programming to couple through this channel of carriers to the bit line or the source line. This applies a field that across the memory cell of the string selected for programming that causes carriers to tunnel to the floating gate or charge trapping layer, altering the threshold voltage level (Vt) of the selected memory cell and storing the data value. If a program-inhibit voltage placed upon the coupled bit line or source line, the applied field is not sufficient to tunnel carriers to the floating gate/node, no data value is programmed and the memory cell remains in the erased state.

After programming the selected memory cell(s), a verify operation is then performed to confirm that the data was successfully programmed. If the programmed memory cell(s) of the erase block fail verification, the program and verify cycle is repeated until the data is successfully programmed or a selected number of iterations have passed and the programming operation is deemed to have failed.

FIGS. 3A-3D illustrate a typical NAND architecture memory array programming operation and program disturb types, the Vpass channel boost, and program disturb likelihoods for a given Vpass voltage. It is noted that the NAND programming operation described in FIGS. 3A-3D is for illustrative purposes and should not be taken as limiting.

Figure 3A:
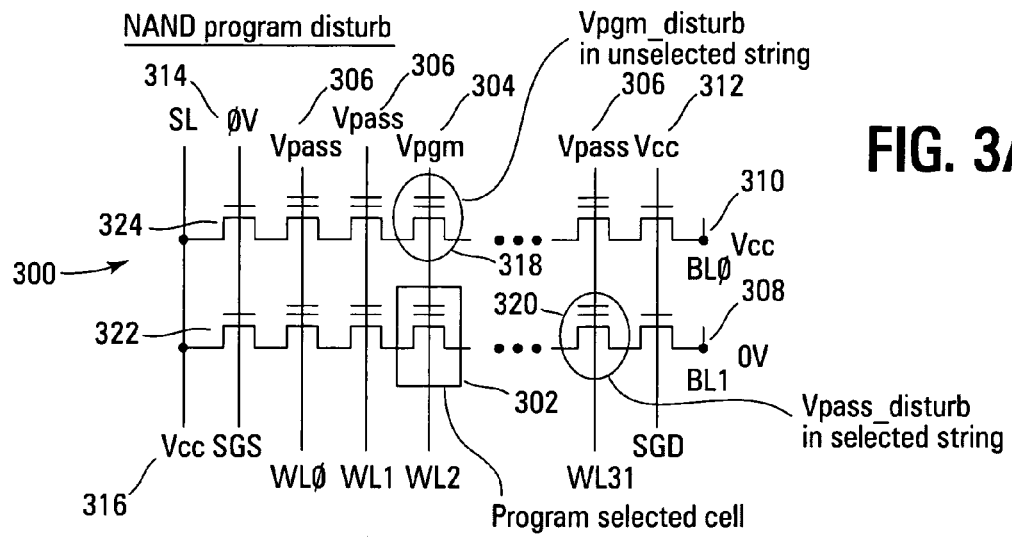
FIGS. 3A-3D shows simplified diagrams of a typical NAND Flash memory array programming operation, channel boost, and program disturb likelihoods.

In FIG. 3A, a typically programming operation in a simplified NAND architecture memory array 300 is illustrated. As noted above, a programming voltage (Vpgm) 304, such as 20V, is coupled to a word line coupled to the gate of the memory cell 302 selected to be programmed. At substantially the same time, the word lines coupled to the gates of the unselected memory cells of the selected memory string 322 are also driven by a pass gate voltage (Vpass) 306, such as 10V, so as to place them in a pass through mode unrestricted by their stored data values and to generate a channel of carriers by capacitive coupling in the memory string 322 for the programming operation. A simplified illustration of this boosted channel of carriers 330 in a selected memory string 322 is shown in FIG. 3B. In FIG. 3A, the selected memory string 322 is then coupled through drain select gate (SGD) 312, which is turned on, to a bit line (BL1) that has a program selected voltage, such as 0V, 308 placed upon it so that the channel of the selected string 322 is tied to the program voltage level of the bit line 308. This applies a field that across the selected memory cell 302 that causes carriers to be injected into the floating gate or charge trapping layer, altering the threshold voltage level (Vt) of the cell 302 and storing the data value. During this operation the selected memory string 322 is isolated from the source line 316 by the source select gate (SGS) 314. The memory cells 318 of unselected memory strings 324 that are also coupled to the selected word line and the word line programming voltage, Vpgm, 304 are prevented from being programmed by having their drain select gate (SGD) transistor 312 turned of, allowing their channels to float and to be boosted to ~7V.

As stated above, program disturb other memory cells can happen during a NAND programming operation, where charge is inadvertently injected into an unselected memory cell, altering its threshold voltage level or programming it. The two common types of program disturb are Vpgm-program disturb and Vpass-program disturb. In Vpgm-program disturb, memory cells 318 that are on adjacent memory cell strings 324 but are coupled to the selected word line carrying the elevated programming voltage, Vpgm, 304 can have an inadvertently large field applied across their channel and gate causing them to be disturbed. In Vpass-program disturb, memory cells 320 that are on the same memory string 322, but which are coupled to the pass voltage, Vpass, inadvertently have a large field applied by a too high Vpass voltage across their channel and gate and can be disturbed.

Figure 3C:
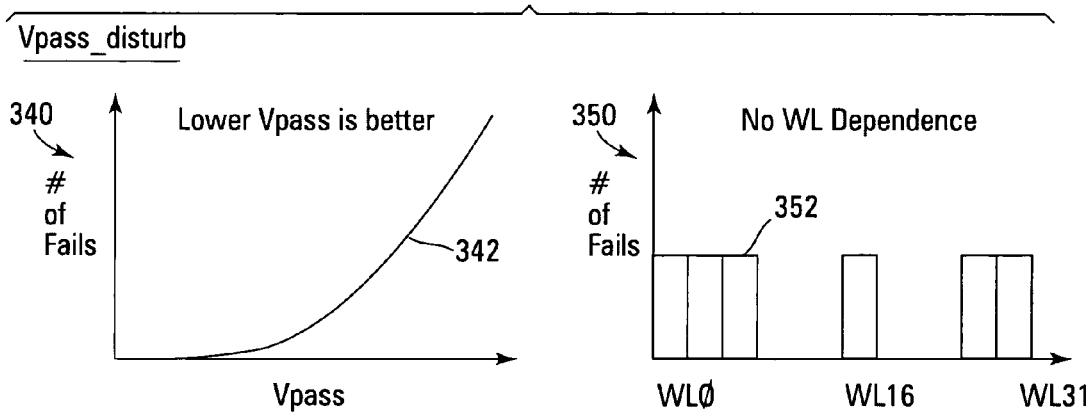

As illustrated in the graphs 340, 350 of FIG. 3C, the probability of a Vpass-program disturb is dependent mainly on the voltage utilized for Vpass 342 and is not dependent 352 on the relative position of the memory cell/word line (WL) 302 being programmed in the memory cell string 322. For Vpass-program disturb, the lower the voltage level utilized for Vpass, the lower the probability of a Vpass-program disturb event due to a lower field being applied across the channel and gates of the unselected memory cells by Vpass and the channel voltage. The higher the voltage level utilized for Vpass, the higher the probability of a Vpass-program disturb in the unselected memory cells of the memory cell string 322.

Figure 3D:
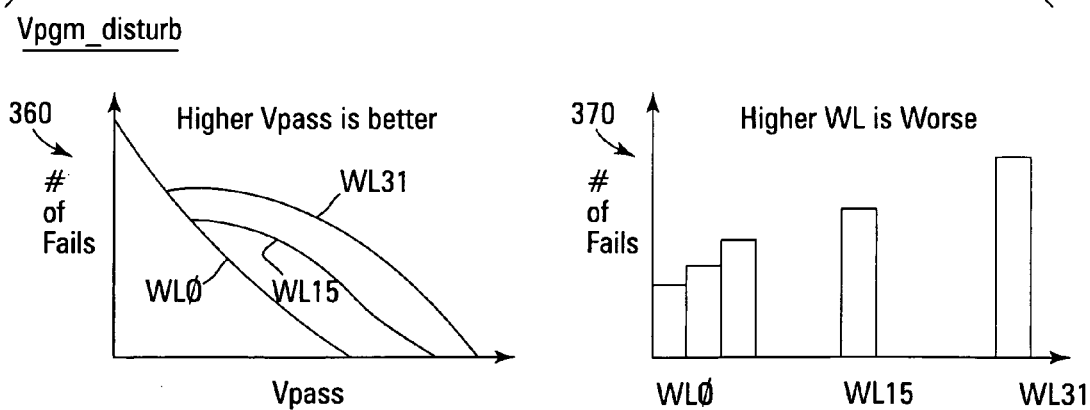
Figure 3B:
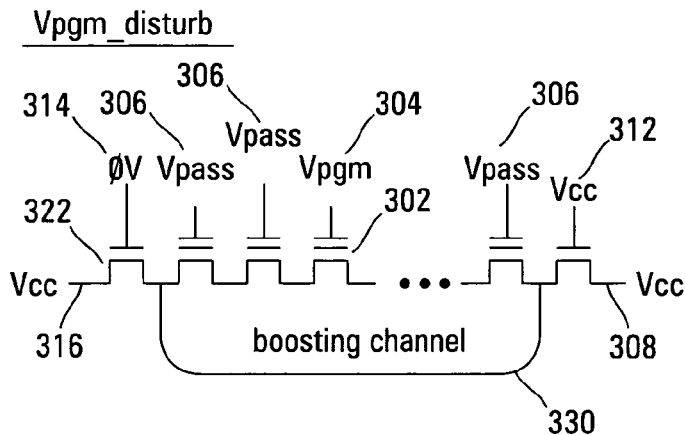

As illustrated in the graphs 360, 370 of FIG. 3D, the probability of a Vpgm-program disturb is dependent on both the voltage level of Vpass 362 and the relative position 364, 366, 368, 372 of the memory cell/word line 302 that is being programmed in the memory string. For Vpgm-program disturb, the higher quality of the channel formed under the memory cells of the string, the higher the coupled channel voltages of the unselected strings and the lower the probability of a Vpgm-disturb event. As shown in the graph 360 of FIG. 3D, Vpgm-disturb in the unselected strings 324 is dependent on the selected Vpass voltage. A higher Vpass is prefered for Vpgm-disturb because of higher channel boosting voltage. As also shown in the graphs 360 and 370 of FIG. 3D, Vpgm-disturb also depends on word line location and/or programming sequence or the memory cells because of the threshold voltages (Vt) of unselected cells. A higher (more positive) Vt of the unselected cells (due to them being programmed) reduces the channel boosting efficiency which increases the probability Vpgm-disturb. Since a NAND string programming operation is typically performed in order from WL0 to WL31, more cells are likely to be already programmed when WL31 is programmed, while all other cells are erased when WL0 is programmed. Thus, the probability of Vpgm-disturb is more serious for WL31, WL30, WL29 than WL0, WL1, WL2. Therefore, the higher the voltage level utilized for Vpass, the lower the probability of a Vpgm-program disturb event due to a higher quality channel being formed by the elevated Vpass voltage under the cells of the memory string 322 and a resulting lower voltage drop from the selected word line, that is carrying Vpgm, and the channel of the unselected strings 324. The lower the voltage level utilized for Vpass, the higher the probability of a Vpgm-program disturb event due to a lower quality channel and coupled channel voltage being formed by the lower Vpass voltage under the cells of the memory strings and a resulting higher voltage differential from the selected word line, that is carrying Vpgm, and the floating channel voltages of the unselected strings 324. In addition, Vpgm-program disturb is also dependent on the position of the selected memory cell/word line in the memory string 322, with the lower the position the lower the probability of due to the higher voltage drop across the length of the boosted string channel and intervening memory cells in the channel. As noted in FIG. 3B, the channel boost voltage is a function of Vpass and the threshold voltage levels of the unselected memory cells/word lines of the memory string 322. It is also noted that NAND memory strings are typically programmed in a sequential manner, from WL0 to WL31, so string resistance is highest programming WL31, particularly in the worst case scenario where all the intervening memory cells (WL0-WL30) have been programmed and have had their threshold voltage levels raised.

Figure 4:
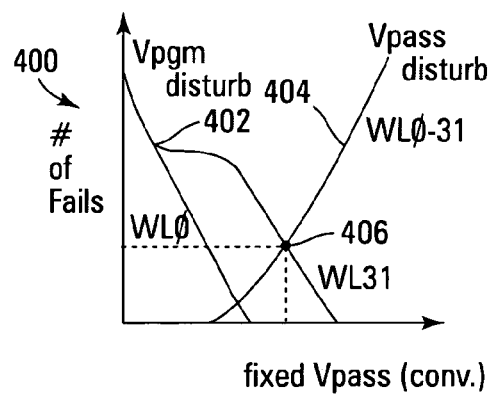
FIG. 4 shows a diagram detailing a typical prior art Vpass selection from program disturb and Vpass disturb distributions.

In prior art NAND architecture memory devices, Vpass is typically selected based on a compromise between program disturb characteristics (minimizing both Vpgm-program disturb and Vpass-program disturb probabilities) and generating a sufficient channel in the memory strings to allow for efficient programming in all memory cell/word line positions (WL0-WL_N) of the memory cell string. In FIG. 4, Vpass is selected in a prior art NAND memory by projecting both the Vpgm-program disturb 402 and Vpass-program disturb 404 probability curves on the same graph 400 and selecting the Vpass voltage at the minimum 406 where they cross (utilizing the higher Vpass WL31 curve of the Vpgm-program disturb probability curve 402), thus arriving at a compromise Vpass that minimizes the probability of program disturb due to both Vpgm-program disturb and Vpass-program disturb while ensuring an adequate Vpass is utilized for channel generation.

Embodiments of the present invention utilize an improved programming method to provide for an overall reduction in program disturb and provide better matching of Vpass to the specific memory cell/word line of the NAND architecture memory cell string being programmed. In embodiments of the present invention, the various cells of strings of non-volatile memory cells are programmed by the application of differing word line pass voltages (Vpass) to the unselected word lines of the memory cell string or array during an programming cycle. This facilitates a faster on average program operation, a reduced program disturb, an increase in memory device endurance and lifetimes due to a decrease in memory cell stress, and a more accurate match of word line pass voltages to the specific memory cell being programmed in the NAND memory string or NAND non-volatile memory array. In one embodiment of the present invention, the differing word line pass voltages (Vpass) are utilized depending on the placement of the memory cell i n the NAND memory cell string. In another embodiment of the present invention, two or more word line pass voltages (Vpass) are utilized at the same time to compensate for faster and slower programming word lines/memory cells. In another embodiment, different word line pass voltages (Vpass) are applied based on physical aspects of the word lines of the array, including, but not limited to, an interlaced array of alternating wide/thin cross section word lines which have higher/lower word line resistances and/or capacitive coupling ratios with the underlying non-volatile memory cells.

In embodiments of the present invention, Vpass is selected and/or varied based on the relative position of the selected word line/memory cell in the memory string being programmed. This allows the Vpass compromise between program disturb characteristics (minimizing both Vpgm-program disturb and Vpass-program disturb probabilities) to be selected and varied based on the relative position of the selected word line in the memory string. In embodiments of the present invention, the Vpass level is selected lower or higher depending on position of selected memory cell/word line in the memory string to decrease the probability of Vpgm-program disturb as higher word lines are programmed by increasing the overall Vpass average. The specific Vpass level can also be tailored higher or lower across the memory string than the overall Vpass being utilized to match the specific word line characteristics (proximity to the bit line/source line, individual word line coupling/resistance levels, alternating word line/cell widths, etc.) and/or the position of the unselected WL in the string to decrease the probability of Vpass-program disturb.

Figure 5:
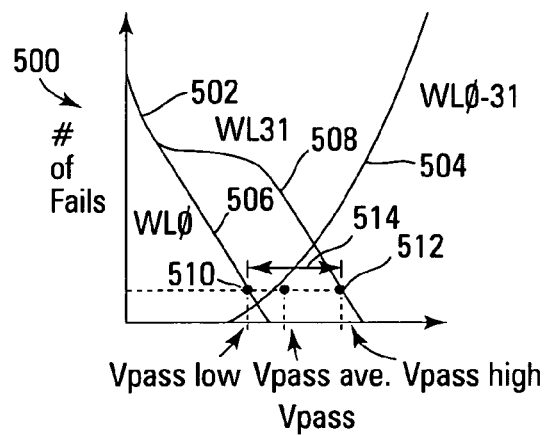
FIG. 5 shows a diagram detailing Vpass selection from program disturb and Vpass disturb distributions in accordance with an embodiment of the present invention.

FIG. 5 illustrates an example of Vpass selection in an embodiment of the present invention. In FIG. 5, Vpass is selected in a NAND architecture memory embodiment of the present invention by projecting both the Vpgm-program disturb 502 and Vpass-program disturb 504 probability curves on the same graph 500 of Vpass level versus probability of program disturb failures, as before. The Vpass voltage level is then selected on a range 514 dependent on the word line position selected for programming and the specific Vpass WL_N curve (WL0 506 to WL31 508, for example) of the Vpgm-program disturb probability curve 502. Thus allowing the Vpass to be varied and selected according to minimize the program disturb (Vpgm-program disturb and Vpass-program disturb probabilities) for the position and characteristics of the given word line/memory cell being programmed and the requirements for adequate channel generation for the selected memory cell position in the memory cell string. This allows for the specific program disturb probability to be smaller when programming lower positioned word lines/memory cells 510, while being at least the same or less than the prior art at higher positioned word lines/memory cells 512. This therefore allows for a lower overall average Vpass and lower overall average disturb probability than the prior art, while enabling more efficient programming at higher positioned memory cells and lower stressing of lower positioned memory cells in the string.

Figure 6A:
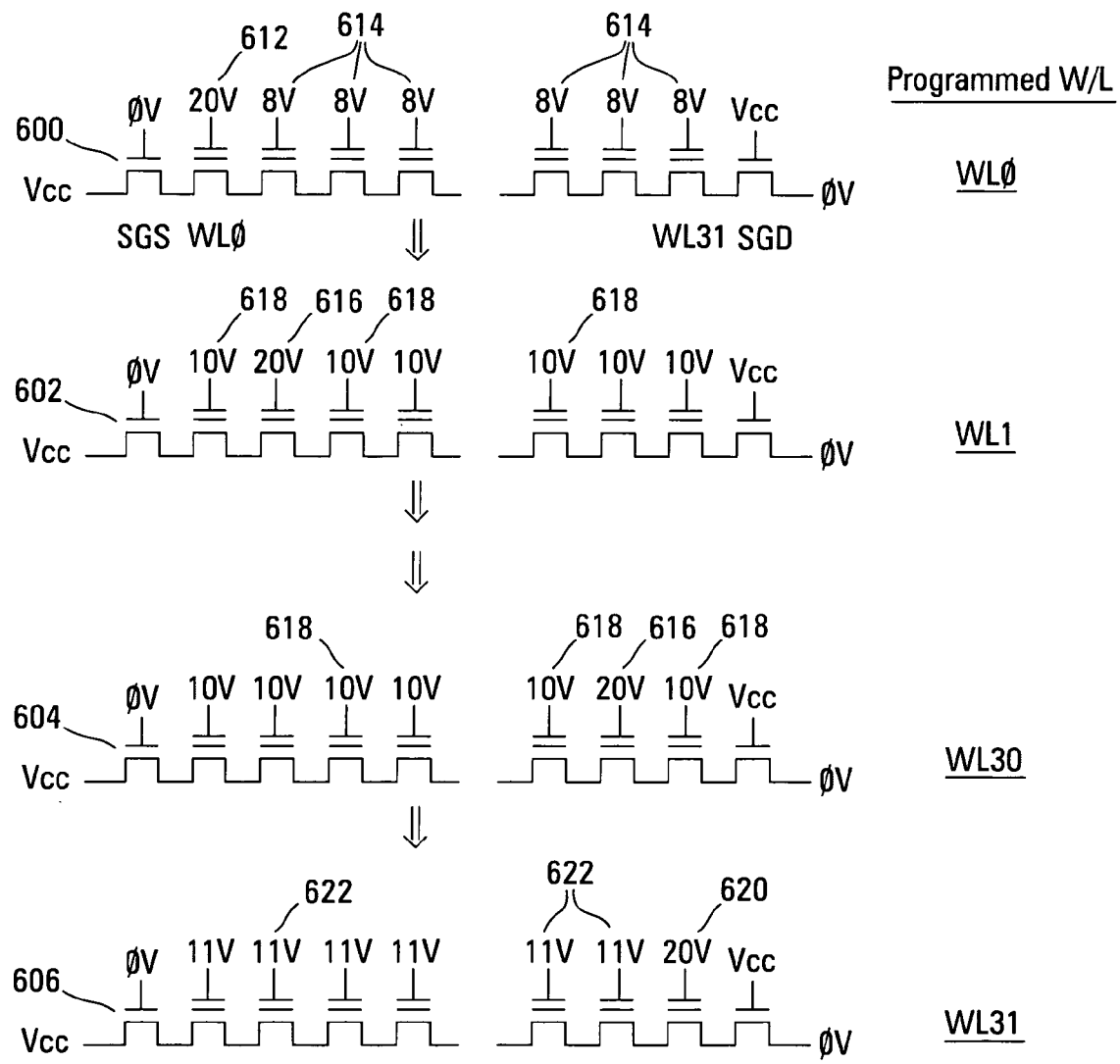
FIGS. 6A-6C detail word line voltages of program operations of NAND architecture Flash memory strings in accordance with embodiments of the present invention.
Figure 6B:
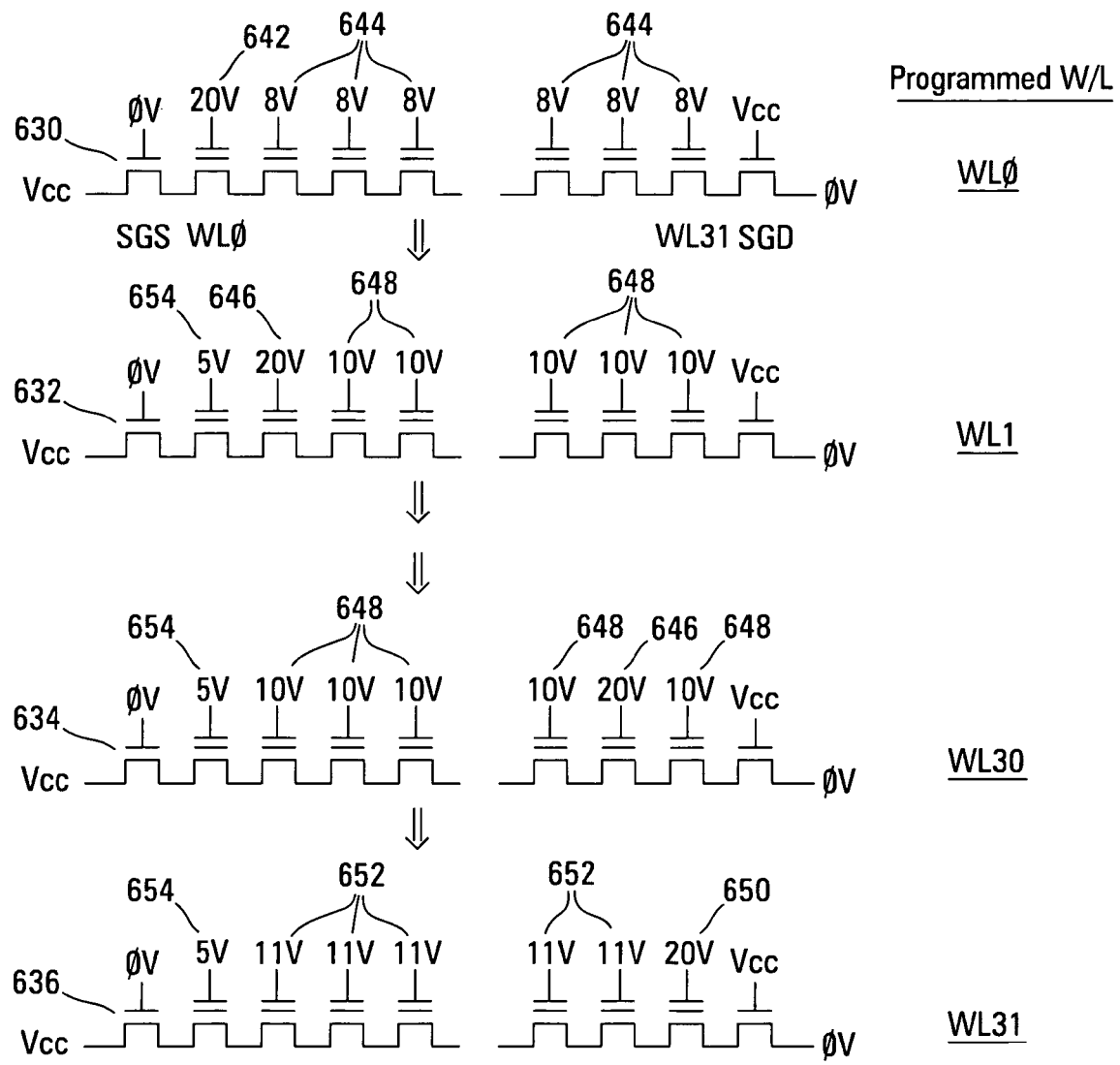
Figure 6C:
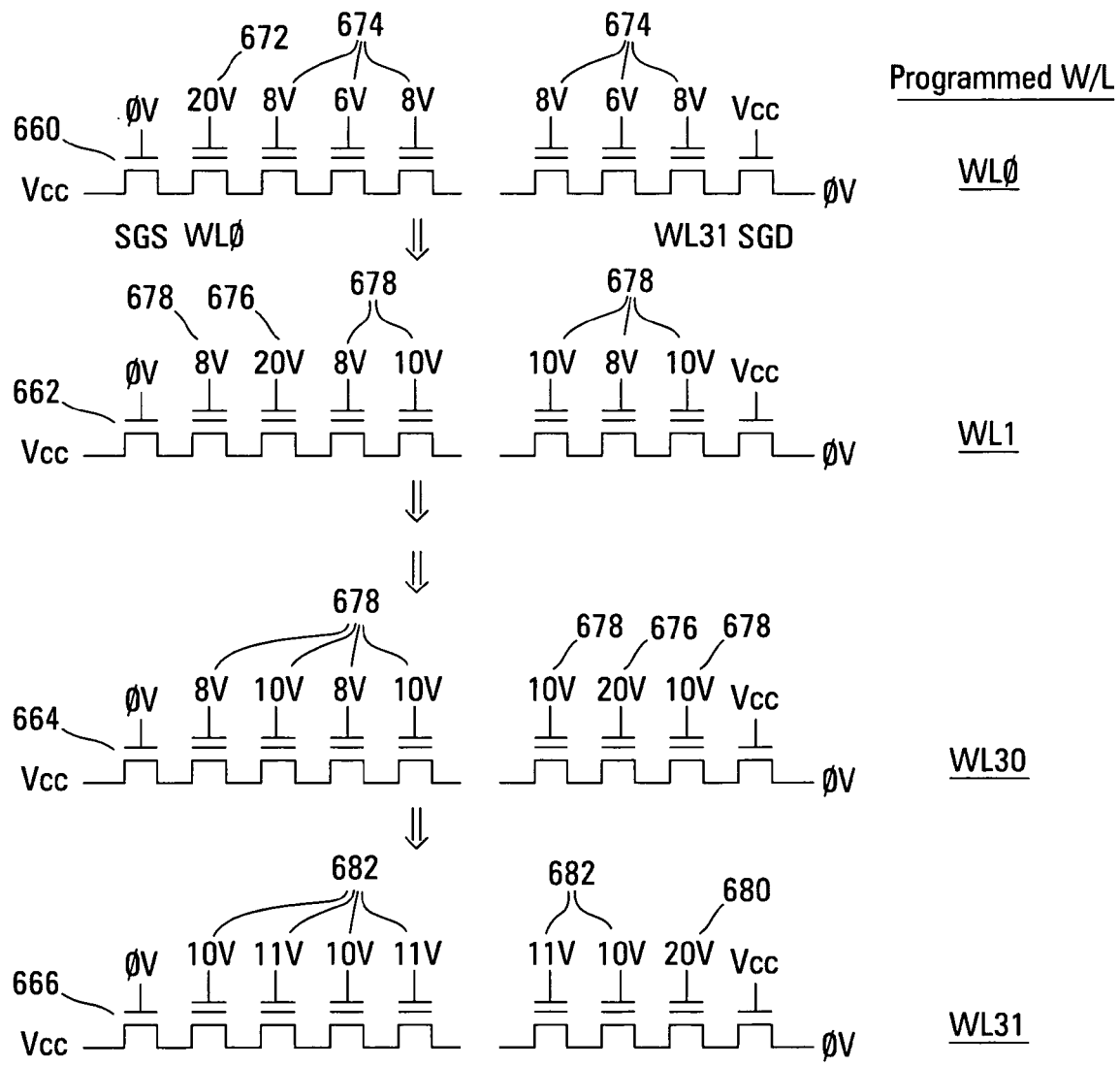

FIGS. 6A-6C detail simplified schematics of NAND memory cell strings of a NAND memory array undergoing various programming operations of embodiments of the present invention. It is noted that in NAND memory arrays and strings, such as detailed in FIGS. 6A-6C, NAND cells are typically programmed in sequential order, from WL0 to WL31. It is also noted that the NAND programming operations described in FIGS. 6A-6C are for illustrative purposes and should not be taken as limiting and that, as stated above, other NAND programming methods and voltage levels incorporating embodiments of the present invention, such as boosted bit line, boosted source line, and boosted substrate tub programming, are possible and will be apparent to those skilled in the art with the benefit of the present disclosure.

In FIG. 6A, a series of simplified schematic diagrams are shown of a NAND memory cell string 600, 602, 604, 606 of a NAND architecture Flash memory array undergoing a programming operation of an embodiment of the present invention for differing word lines/memory cells in the string. In the first string 600, the memory cell coupled to WL0 612 (and therefore furthest from the bit line) is being programmed by the application of a programming voltage (Vpgm) of 20V. Because WL0 is being programmed, a lowered pass voltage (Vpass) of 8V is being applied to the remaining unselected word lines 614 of the string 600. In middle strings 602 and 604, the memory cells coupled to WL1 to WL30 616 are programmed by the application of a programming voltage (Vpgm) of 20V. As word lines from the middle (WL1-WL30) of the string 602, 604 are programmed, a mid-level pass voltage (Vpass) of 10V is selected and applied to the unselected word lines 618 of the string. In the last string 606, the last memory cell of the string 606 coupled to WL31 620 (and therefore requiring a larger channel boost) is being programmed by the application of a programming voltage (Vpgm) of 20V. Because WL31 is programmed, a higher Vpass of 11V is applied to the remaining unselected word lines 622 of the string 606 to boost the channel. It is noted that the embodiment of FIG. 6A is for illustrative purposes and that the scaling of Vpass in other embodiments of the present invention can be implemented differently, up to and including selecting a different Vpass for each different word line/memory cell position selected for programming and not just differ for the programming of the first 600 and last 606 (WL0 and WL31) word lines as in the embodiment of FIG. 6A.

As stated above, due to differences in the word lines, given word lines in an erase block can have faster or slower programming and/or program disturb characteristics. This is due to issues that can include, but are not limited to, different word line resistance, differing word line designs/shapes, the word line physical placement in the memory array, device wear levels (memory cell write fatigue), manufacturing process variations, and the word line coupling to the memory cells and other adjacent elements and word lines of the memory array. Because of this, memory cells at differing positions in the memory cell strings of the erase block can have different program disturb characteristics and/or require differing Vpass voltage levels to avoid Vpgm-program disturb and Vpass-program disturb.

In FIG. 6B, another series of simplified schematic diagrams of a NAND memory cell string 630, 632, 634, 636 of a NAND architecture Flash memory array undergoing a programming operation of another embodiment of the present invention are shown. In the first string 630, the memory cell coupled to WL0 642 is being programmed by the application of a programming voltage (Vpgm) of 20V. Because WL0 is being programmed, a lowered pass voltage (Vpass) of 8V is being applied to the remaining unselected word lines 644 of the string 630. As in FIG. 6A, in middle strings 632 and 634, the memory cells coupled to WL1 to WL30 646 are programmed by the application of a programming voltage (Vpgm) of 20V and a mid-level pass voltage (Vpass) of 10V is selected and applied to the unselected word lines 648 of the string. In the last string 636, the last memory cell of the string 636 coupled to WL31 650 is programmed by the application of a programming voltage (Vpgm) of 20V, and a higher Vpass of 11V is applied to the remaining unselected word lines 652 of the string 636 to boost the channel. However, in FIG. 6B, due to the proximity of WL0 to the end of the memory cell string, a separate lower pass voltage of 5V 654 is applied to WL0 during WL1-31 programming to improve Vpgm-disturb in the unselected NAND strings. The channel in the memory cells of an unselected NAND string will be boosted to ~7V in FIG. 6B, so that there is a high electric field around SGS and WL0. This high electric field across SGS and WL0 may cause unwanted junction leakage of the boosted channel voltage and degrade Vpgm-disturb. Applying a smaller Vpass of 5V can reduce the electric field in the substrate between SGS and WL0 improves Vpgm-disturb.

In FIG. 6C, yet another series of simplified schematic diagrams of a NAND memory cell string 660, 662, 664, 666 of a NAND architecture Flash memory array undergoing a programming operation of yet another embodiment of the present invention are shown. The NAND memory cell strings 660, 662, 664, 666 of FIG. 6C contain word lines with alternating thicknesses and memory cell widths, resulting in differing word line resistances and coupling ratios for the memory cells of the string. An alternating pattern of word line pass voltages are thus applied the unselected word lines of FIG. 6C to compensate for this. In the first string 660, the memory cell coupled to WL0 672 is being programmed by the application of a programming voltage (Vpgm) of 20V. Because WL0 is being programmed, lowered pass voltages (Vpass) of 8V and 6V are applied to the remaining unselected word lines 674 of the string 660 in an alternating pattern depending on the underlying word line/cell width. As in FIGS. 6A and 6B, in middle strings 662 and 664, the memory cells coupled to WL1 to WL30 676 are programmed by the application of a programming voltage (Vpgm) of 20V and mid-level pass voltages (Vpass) of 10V and 8V are selected and applied in an alternating pattern to the unselected word lines 678 of the string. In the last string 666, the last memory cell of the string 666 coupled to WL31 680 is programmed by the application of a programming voltage (Vpgm) of 20V, and higher Vpass voltages of 11V and 10V are applied in an alternating pattern to the remaining unselected word lines 682 of the string 666 to boost the channel.

Vpass voltage during programming is summarized in the following Tables 1-6.

SUMMARY TABLES FOR FIG. 6A

TABLE 1

Vpass_low for the first (WL0) word line program
Vpass_high for the last (WL31) word line program
Vpass_ave. for all other word lines program

| | WL0 | WL1 | WL2 | WL29 | WL30 | WL31 |
|---|---|---|---|---|---|---|
| programming in order from WL0 to WL31 | Vpgm | Vpass_low | Vpass_low | Vpass_low | Vpass_low | Vpass_low |
| | Vpass_ave. | Vpgm | Vpass_ave. | Vpass_ave. | Vpass_ave. | Vpass_ave. |
| | Vpass_ave. | Vpass_ave. | Vpgm | Vpass_ave. | Vpass_ave. | Vpass_ave. |
| | Vpass_ave. | Vpass_ave. | Vpass_ave. | Vpgm | Vpass_ave. | Vpass_ave. |
| | Vpass_ave. | Vpass_ave. | Vpass_ave. | Vpass_ave. | Vpgm | Vpass_ave. |
| | Vpass_high | Vpass_high | Vpass_high | Vpass_high | Vpass_high | Vpgm |

TABLE 2

Vpass_low for the first two or more (WL0 to WLx) word lines program
Vpass_high for the last two or more (WLy to WL31) word lines program
Vpass_ave. for all other word lines program

| | WL0 | WL1 | WLx + 1 | WLy − 1 | WL30 | WL31 |
|---|---|---|---|---|---|---|
| programming in order from WL0 to WL31 ↓ | Vpgm | Vpass_low | Vpass_low | Vpass_low | Vpass_low | Vpass_low |
| | Vpass_low | Vpgm | Vpass_low | Vpass_low | Vpass_low | Vpass_low |
| | Vpass_ave. | Vpass_ave. | Vpgm | Vpass_ave. | Vpass_ave. | Vpass_ave. |
| | Vpass_ave. | Vpass_ave. | Vpass_ave. | Vpgm | Vpass_ave. | Vpass_ave. |
| | Vpass_high | Vpass_high | Vpass_high | Vpass_high | Vpgm | Vpass_high |
| | Vpass_high | Vpass_high | Vpass_high | Vpass_high | Vpass_high | Vpgm |

TABLE 3

Vpass_low for the first word lines program
Vpass_high for the last word lines program
Vpass_ave. for all other word lines program

| | WL0 | WL1 | WL2 | WL29 | WL30 | WL31 |
|---|---|---|---|---|---|---|
| programming randomly ↓ | Vpass_low | Vpass_low | Vpass_low | Vpass_low | Vpass_low | Vpass_low |
| | Vpass_low | Vpgm | Vpass_low | Vpass_ave. | Vpass_low | Vpass_low |
| | Vpass_ave. | Vpass_ave. | Vpgm | Vpass_ave. | Vpass_ave. | Vpass_ave. |
| | Vpass_ave. | Vpass_ave. | Vpass_ave. | Vpass_high | Vpass_ave. | Vpgm |
| | Vpgm | Vpass_high | Vpass_high | Vpass_high | Vpass_high | Vpass_high |
| | Vpass_high | Vpass_high | Vpass_high | | Vpgm | Vpass_high |

SUMMARY TABLES FOR FIG. 6B

TABLE 4

Vpass_low for the first (WL0) word line program

Vpass_high for the last (WL31) word line program

Vpass_ave. for all other word lines program

| | WL0 | WL1 | WL2 | WL29 | WL30 | WL31 |
|---|---|---|---|---|---|---|
| programming in order from WL0 to WL31 ↓ | Vpgm | Vpass_low | Vpass_low | Vpass_low | Vpass_low | Vpass_low |
| | Vpass_very_low | Vpgm | Vpass_ave. | Vpass_ave. | Vpass_ave. | Vpass_ave. |
| | Vpass_very_low | Vpass_ave. | Vpgm | Vpass_ave. | Vpass_ave. | Vpass_ave. |
| | Vpass_very_low | Vpass_ave. | Vpass_ave. | Vpgm | Vpass_ave. | Vpass_ave. |
| | Vpass_very_low | Vpass_ave. | Vpass_ave. | Vpass_ave. | Vpgm | Vpass_ave. |
| | Vpass_very_low | Vpass_high | Vpass_high | Vpass_high | Vpass_high | Vpgm |

TABLE 5

Vpass_low for the first two or more (WL0 to WLx) word lines program

Vpass_high for the last two or more (WLy to WL31) word lines program

Vpass_ave. for all other word lines program

| | WL0 | WL1 | WLx + 1 | Wly − 1 | WL30 | WL31 |
|---|---|---|---|---|---|---|
| programming in order from WL0 to WL31 ↓ | Vpgm | Vpass_low | Vpass_low | Vpass_low | Vpass_low | Vpass_low |
| | Vpass_very_low | Vpgm | Vpass_low | Vpass_low | Vpass_low | Vpass_low |
| | Vpass_very_low | Vpass_ave. | Vpgm | Vpass_ave. | Vpass_ave. | Vpass_ave. |
| | Vpass_very_low | Vpass_ave. | Vpass_ave. | Vpgm | Vpass_ave. | Vpass_ave. |
| | Vpass_very_low | Vpass_high | Vpass_high | Vpass_high | Vpgm | Vpass_high |
| | Vpass_very_low | Vpass_high | Vpass_high | Vpass_high | Vpass_high | Vpgm |

TABLE 6

Vpass_low for the first word lines program
Vpass_high for the last word lines program
Vpass_ave. for all other word lines program

| | WL0 | WL1 | WL2 | WL29 | WL30 | WL31 |
|---|---|---|---|---|---|---|
| programming randomly | Vpass_very_low | Vpass_low | Vpass_low | Vpgm | Vpass_low | Vpass_low |
| | Vpass_very_low | Vpgm | Vpass_low | Vpass_low | Vpass_low | Vpass_low |
| | Vpass_very_low | Vpass_ave. | Vpgm | Vpass_ave. | Vpass_ave. | Vpass_ave. |
| | Vpass_very_low | Vpass_ave. | Vpass_ave. | Vpass_ave. | Vpass_ave. | Vpgm |
| | Vpgm | Vpass_high | Vpass_high | Vpass_high | Vpass_high | Vpass_high |
| | Vpass_very_low | Vpass_high | Vpass_high | Vpass_high | Vpgm | Vpass_high |

As shown in Table 1, Vpass_low is applied to the unselected word lines of the memory cell string during WL0 programming. Vpass_middle or Vpass_ave. is applied to the unselected word lines during WL1-30 programming. Vpass_high is applied to the unselected word lines during WL31 programming. As shown in Table 2, Vpass_low is applied to the unselected word lines during the first several word lines being programmed. Vpass_high is applied to the unselected word lines during the last several word lines being programmed. Vpass_ave. is applied to unselected word lines during all other word lines programming.

Table 3 details an embodiment of the present invention that is randomly programming memory cells/word lines in the memory cell string. In this embodiment, Vpass is selected based on the order of programming instead of the location of word lines. Vpass_low is applied to the unselected word lines during the programming of the first one or more memory cells of the memory cell string. Vpass_high is applied to the unselected word lines during the last one or more memory cells of the memory cell string 600 are programmed. Vpass_ave. is applied to unselected word lines during the programming of all other cells of the memory cell string.

As shown in tables 4-6, a selected Vpass_very_low (such as 5V) can be applied to WL0 during the programming of WL1-31 of the memory cell string to improve Vpgm_disturb in unselected NAND memory cell strings. The memory cell channels in the adjacent unselected NAND strings are boosted to ~7V so that there is a high electric field across the source select gate (SGS) and WL0. It may cause unwanted junction leakage to the channel and may degrade Vpgm-disturb. Applying the smaller Vpass_very_low to WL0 can reduce the electric field in a substrate between SGS and WL0 and, therefore, improve Vpgm_disturb. It is preferrable, but is not limited to, that Vpass_very_low be larger than a maximum Vt of a programmed memory cell of the array to make sure that channel is formed under WL0.

As will be apparent to one skilled in the art, differing Vpass and Vpgm word line voltages and patterns can be set in embodiments of the present invention to compensate for a variety of different word line characteristics, program speeds or program disturb susceptibilities.

Figure 7:
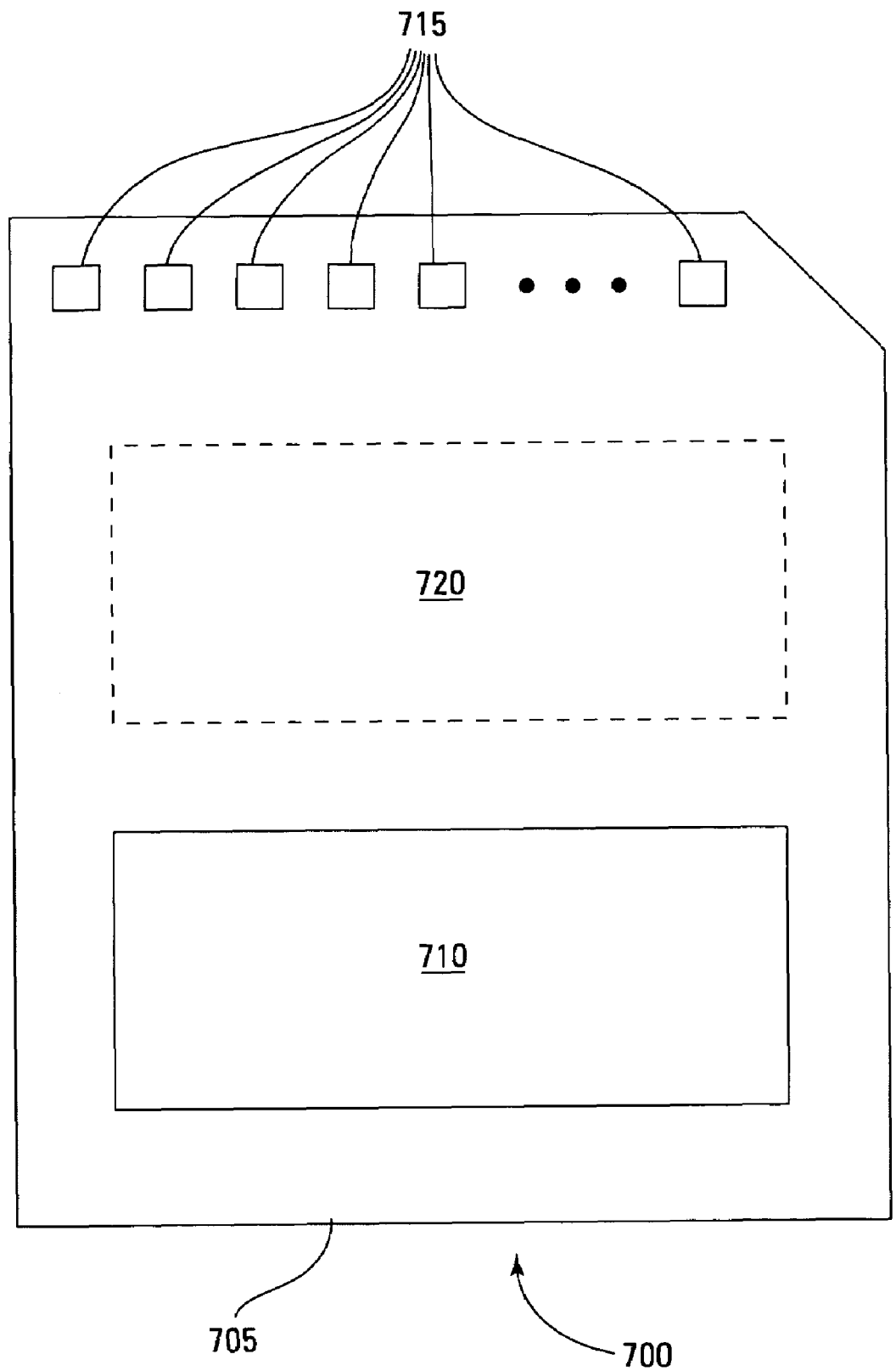
FIG. 7 is a simplified block diagram of a memory module in accordance with an embodiment of the present invention.

FIG. 7 is an illustration of an exemplary memory module 700. Memory module 700 is illustrated as a memory card, although the concepts discussed with reference to memory module 700 are applicable to other types of removable or portable memory, e.g., USB flash drives, and are intended to be within the scope of "memory module" as used herein. In addition, although one example form factor is depicted in FIG. 7, these concepts are applicable to other form factors as well.

In some embodiments, memory module 700 will include a housing 705 (as depicted) to enclose one or more memory devices 710, though such a housing is not essential to all devices or device applications. At least one memory device 710 is a non-volatile memory including circuits of or adapted to perform elements of methods of the present invention. Where present, the housing 705 includes one or more contacts 715 for communication with a host device. Examples of host devices include digital cameras, digital recording and playback devices, PDAs, personal computers, memory card readers, interface hubs and the like. For some embodiments, the contacts 715 are in the form of a standardized interface. For example, with a USB flash drive, the contacts 715 might be in the form of a USB Type-A male connector. For some embodiments, the contacts 715 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 715 provide an interface for passing control, address and/or data signals between the memory module 700 and a host having compatible receptors for the contacts 715.

The memory module 700 may optionally include additional circuitry 720 which may be one or more integrated circuits and/or discrete components. For some embodiments, the additional circuitry 720 may include a memory controller for controlling access across multiple memory devices 710 and/or for providing a translation layer between an external host and a memory device 710. For example, there may not be a one-to-one correspondence between the number of contacts 715 and a number of I/O connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710 such as logic functions as might be performed by an ASIC (application specific integrated circuit). Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

It is noted that other erase operations and voltage levels for non-volatile memory device and array embodiments of the present invention are possible and will be apparent for those skilled in the art with the benefit of this disclosure.

CONCLUSION

A NAND architecture non-volatile memory device and programming process has been described that programs the various cells of strings of non-volatile memory cells by the application of differing word line pass voltages (Vpass) to the unselected word lines of the memory cell string or array during an programming cycle. This facilitates a faster on average program operation, an increase in memory device endurance and lifetimes due to a decrease in memory cell overstress, and a more accurate match of word line pass voltages to the specific memory cell being programmed in the NAND memory string or NAND non-volatile memory array. In one embodiment of the present invention, the differing word line pass voltages (Vpass) are utilized depending on the placement of the memory cell in the NAND memory cell string. In another embodiment of the present invention, the differing word line pass voltages (Vpass) are utilized to compensate for faster and slower programming word lines/memory cells. In another embodiment, different word line pass voltages (Vpass) are applied based on physical aspects of the word lines of the array, including, but not limited to, an interlaced array of alternating wide/thin cross section word lines which have higher/lower word line resistances and/or capacitive coupling ratios with the underlying non-volatile memory cells.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of programming memory cells of a NAND architecture memory string, comprising:
   selecting a memory cell of a NAND architecture memory string of a non-volatile memory array for programming; and
   selecting and applying a first pass voltage from a plurality of pass voltages to a gate of one or more first unselected memory cells of the string based on the memory cell position of the selected memory cell in the NAND architecture memory string.

2. The method of claim 1, wherein selecting and applying a first pass voltage from a plurality of pass voltages to a gate of one or more first unselected memory cells of the string based on the memory cell position of the selected memory cell in the NAND architecture memory string further comprises selecting and applying a lower than average pass voltage to a gate of one or more first unselected memory cells of the string when a memory cell coupled to an initial word line in the NAND architecture memory string is programmed and selecting and applying a higher than average pass voltage to a gate of one or more first unselected memory cells of the string when a memory cell coupled to a final word line in the NAND architecture memory string is programmed.

3. The method of claim 1, wherein selecting and applying a first pass voltage from a plurality of pass voltages to a gate of one or more first unselected memory cells of the string based on the memory cell position of the selected memory cell in the NAND architecture memory string further comprises selecting and applying a pass voltage from a plurality of pass voltages to a gate of one or more first unselected memory cells of the string based on the memory cell position of the selected memory cell in the NAND architecture memory string and the probability of program disturb in an erase block containing the NAND architecture memory string for the selected pass voltage and selected memory cell position being programmed.

4. The method of claim 1, wherein selecting and applying a first pass voltage from a plurality of pass voltages to a gate of one or more first unselected memory cells of the string based on the memory cell position of the selected memory cell in the NAND architecture memory string further comprises selecting and applying two or more pass voltages to different gates of the one or more first unselected memory cells of the string.

5. The method of claim 1, further comprising applying a program voltage a gate of the selected memory cell and coupling one of a program and a program-inhibit voltage to a channel of the NAND architecture memory string.

6. The method of claim 1, further comprising selecting a second pass voltage to apply to one or more second unselected memory cells of the string based on one of a physical or electrical characteristic of the one or more second unselected memory cells, and the memory cell position of the one or more second unselected memory cells in the NAND architecture memory string.

7. The method of claim 6, wherein physical or electrical characteristics of the one or more second unselected memory cells of the string are one of the program speed of each of the one or more second unselected memory cells of the string, the resistance of word lines coupled to each of the one or more second unselected memory cells of the string, the coupling ratio of word lines coupled to the gate of each of the one or more second unselected memory cells of the string, and the cross-sectional area of word lines coupled to the gate of each of the one or more second unselected memory cells of the string.

8. A method of operating a NAND architecture non-volatile memory array, comprising:
   selecting a memory cell in one or more NAND architecture memory cell strings for programming in a selected block of non-volatile memory cells, where the selected memory cell in each of the one or more memory cell strings is coupled to a word line;
   applying a program voltage to the word line coupled to the selected memory cells; and
   selecting and applying a first pass voltage from two or more pass voltages to one or more first unselected word lines coupled to one or more first unselected memory cells of the one or more memory cell strings based on the word line position of the selected memory cells and word line in the one or more NAND architecture memory strings.

9. The method of claim 8, wherein selecting and applying a first pass voltage from two or more pass voltages to one or more first unselected word lines coupled to one or more first unselected memory cells of the one or more memory cell strings based on the word line position of the selected memory cells and word line in the one or more NAND architecture memory strings further comprises selecting and applying a lower than average pass voltage to the one or more first unselected word lines when an initial word line in the one or more NAND architecture memory strings is the selected word line and selecting and applying a higher than average pass voltage to the one or more first unselected word lines when a final word line in the one or more NAND architecture memory strings is the selected word line.

10. The method of claim 8, wherein selecting and applying a first pass voltage from two or more pass voltages to one or more first unselected word lines coupled to one or more first unselected memory cells of the one or more memory cell strings based on the word line position of the selected memory cells and word line in the one or more NAND architecture memory strings further comprises selecting and applying a lower than average pass voltage to the one or more first unselected word lines based on the position of the selected word line in the one or more NAND architecture memory strings and the probability of program disturb in the one or more NAND architecture memory strings for the selected pass voltage and selected word line position being programmed.

11. The method of claim 8, wherein selecting and applying a first pass voltage from two or more pass voltages to one or more first unselected word lines coupled to one or more first unselected memory cells of the one or more memory cell strings based on the word line position of the selected memory cells and word line in the one or more NAND architecture memory strings further comprises selecting and applying two or more pass voltages to two or more word lines of the one or more first unselected word lines.

12. The method of claim 8, further comprising applying one of a program and a program-inhibit voltage to a channel of each of the NAND architecture memory strings.

13. The method of claim 8, further comprising selecting a second pass voltage to apply to one or more second unselected word lines based on the word line position of the one or more second unselected word lines in the one or more NAND architecture memory strings.

14. The method of claim 8, further comprising selecting a second pass voltage to apply to one or more second unselected word lines based on one of the program speed of each of the one or more second unselected word lines, the resistance of the one or more second unselected word lines, the coupling ratio of the one or more second unselected word lines, and the cross-sectional area of the one or more second unselected word lines.

15. A non-volatile NAND architecture memory device comprising:
a NAND architecture non-volatile memory array having a plurality of memory blocks; and
a control circuit, wherein the control circuit is adapted to program memory cells in a selected memory block of the non-volatile memory array by,
selecting a memory cell in one or more NAND architecture memory cell strings for programming in a selected block of non-volatile memory cells, where the selected memory cell in each of the one or more memory cell strings is coupled to a word line,
applying a program voltage to the word line coupled to the selected memory cells, and
selecting and applying a first pass voltage from a plurality of pass voltages to one or more first unselected word lines coupled to one or more first unselected memory cells of the one or more memory cell strings based on the memory cell position of the selected memory cells and word line in the one or more NAND architecture memory strings.

16. The non-volatile NAND architecture memory device of claim 15, wherein the control circuit is adapted to select and apply a lower than average first pass voltage to the one or more first unselected word lines when an initial word line in the one or more NAND architecture memory strings is the selected word line and select and apply a higher than average first pass voltage to the one or more first unselected word lines when a final word line in the one or more NAND architecture memory strings is the selected word line.

17. The non-volatile NAND architecture memory device of claim 15, wherein the control circuit is adapted to select and apply a lower than average first pass voltage to the one or more first unselected word lines based on the memory cell position of the selected word line in the one or more NAND architecture memory strings and the probability of program disturb in the one or more NAND architecture memory strings for the selected pass voltage and selected word line position being programmed.

18. The non-volatile NAND architecture memory device of claim 15, wherein the control circuit is adapted to select and apply two or more differing first pass voltages to two or more word lines of the one or more first unselected word lines.

19. The non-volatile NAND architecture memory device of claim 15, wherein the control circuit is adapted to apply one of a program voltage and a program-inhibit voltage to a channel of each of the NAND architecture memory strings.

20. The non-volatile NAND architecture memory device of claim 15, wherein the control circuit is adapted to select a second pass voltage to apply to one or more second unselected word lines based on the memory cell position of the one or more second unselected word lines in the one or more NAND architecture memory strings.

21. The non-volatile NAND architecture memory device of claim 15, wherein the control circuit is adapted to select a second pass voltage to apply to one or more second unselected word lines based on one of the program speed of each of the one or more second unselected word lines, the resistance of the one or more second unselected word lines, the coupling ratio of the one or more second unselected word lines, and the cross-sectional area of the one or more second unselected word lines.

22. A system comprising:
a host coupled to a non-volatile memory device, wherein the non-volatile memory device comprises,
a NAND architecture non-volatile memory array having a plurality of blocks;
wherein the system is adapted to program memory cells in a selected block of the non-volatile memory array by,
selecting a memory cell in one or more NAND architecture memory cell strings for programming in the selected block of non-volatile memory cells, where the selected memory cell in each of the one or more memory cell strings is coupled to a word line, applying a program voltage to the word line coupled to the selected memory cells, and selecting and applying a first pass voltage to one or more first unselected word lines coupled to one or more first unselected memory cells of the one or more memory cell strings based on the word line position of the selected memory cells and word line in the one or more NAND architecture memory strings.

23. The system of claim 22, wherein the host is one of a processor and a memory controller.

24. The system of claim 22, wherein the system is adapted to select and apply a lower than average first pass voltage to the one or more first unselected word lines when an initial word line in the one or more NAND architecture memory strings is the selected word line and select and apply a higher than average first pass voltage to the one or more first unselected word lines when a final word line in the one or more NAND architecture memory strings is the selected word line.

25. The system of claim 22, wherein the system is adapted to select and apply a lower than average first pass voltage to the one or more first unselected word lines based on the word line position of the selected word line in the one or more NAND architecture memory strings and the probability of program disturb in the one or more NAND architecture memory strings for the selected pass voltage and selected word line position being programmed.

26. The system of claim 22, wherein the system is adapted to select and apply two or more different first pass voltages to two or more word lines of the one or more first unselected word lines.

27. The system of claim 22, wherein the system is adapted to select a second pass voltage to apply to one or more second unselected word lines based on the word line position of the one or more second unselected word lines in the one or more NAND architecture memory strings.

28. The system of claim 22, wherein the system is adapted to select a second pass voltage to apply to one or more second unselected word lines based on one of the program speed of each of the one or more second unselected word lines, the resistance of the one or more second unselected word lines, the coupling ratio of the one or more second unselected word lines, and the cross-sectional area of the one or more second unselected word lines.

29. A memory module, comprising:
at least one NAND architecture memory device containing an array with a plurality of non-volatile memory cells arranged in a plurality of memory blocks;
a housing enclosing the at least one memory device; and
a plurality of contacts configured to provide selective contact between the at least one memory device and a host system;
wherein the memory module is adapted to program a selected memory block of the at least one memory device by,
selecting a memory cell in one or more NAND architecture memory cell strings for programming in a selected block of non-volatile memory cells, where the selected memory cell in each of the one or more memory cell strings is coupled to a word line,
applying a program voltage to the word line coupled to the selected memory cells, and
selecting and applying a first pass voltage from a plurality of pass voltages to one or more unselected word lines coupled to one or more unselected memory cells of the one or more memory cell strings based on the memory cell position of the selected memory cells and word line in the one or more NAND architecture memory strings.

30. The module of claim 29, further comprising a memory controller coupled to the at least one memory device for controlling operation of each memory device in response to the host system.

31. A memory module, comprising:
a plurality of contacts; and
two or more memory devices, each having access lines selectively coupled to the plurality of contacts;
wherein at least one of the memory devices comprises:
a NAND architecture non-volatile memory array having a plurality of memory blocks,
wherein the memory module is adapted to program memory cells in a selected block of the non-volatile memory array by,
selecting a memory cell in one or more NAND architecture memory cell strings for programming in a selected block of non-volatile memory cells, where the selected memory cell in each of the one or more memory cell strings is coupled to a word line,
applying a program voltage to the word line coupled to the selected memory cells, and
selecting and applying first pass voltage from two or more pass voltages to one or more unselected word lines coupled to one or more unselected memory cells of the one or more memory cell strings, wherein the first pass voltage is selected based on the word line position of the memory cells and word line in the one or more NAND architecture memory strings selected for programming.

32. A memory module, comprising:
a housing having a plurality of contacts; and
one or more memory devices enclosed in the housing and selectively coupled to the plurality of contacts;
wherein the memory module is adapted to program memory cells in a selected block of at least one of the memory devices by,
applying a first voltage to a first word line of the block, each first word line coupled to a selected non-volatile memory cell of one or more NAND memory cell strings of the block,
applying a second voltage to one or more second word lines of the block, each second word line coupled to one or more unselected non-volatile memory cells of the one or more NAND memory cell strings of the block, and
applying a third voltage to a channel of each of the one or more NAND memory cell strings,
wherein the second and third voltages are each different from the first voltage and where the second voltage is selected from a plurality of possible second voltages based on the memory cell position of the first word line in each of the one or more NAND memory cell strings.

33. A method of programming memory cells in a NAND architecture array of non-volatile memory cells, comprising:
applying a first voltage to a first word line of a block, each first word line coupled to a selected non-volatile memory cell of one or more NAND memory cell strings of the block;
applying a second voltage to one or more second word lines of the block, each second word line coupled to one or more unselected non-volatile memory cells of the one or more NAND memory cell strings of the block; and applying a third voltage to a channel of each of the one or more NAND memory cell strings;

wherein the second and third voltages are each different from the first voltage and the second voltage is selected by the position of the first word line in each of the one or more NAND memory cell strings;

wherein the first and third voltages are expected to cause programming of a nominal memory cell of each of the one or more NAND memory cell strings of the block if applied across its word line and the channel.

34. The method of claim 33, wherein the first voltage is greater than the second and third voltages.

35. The method of claim 34, wherein the second voltage is greater than the third voltage.

36. The method of claim 33, further comprising:
applying a fourth voltage to one or more third word lines of the block, each third word line coupled to one or more of the non-volatile memory cells of the one or more NAND memory cell strings of the block;
wherein the fourth voltage is different from at least the first and second voltages.

37. A method of programming memory cells of a NAND architecture memory string, comprising:
applying a programming voltage to a first memory cell of a NAND architecture memory string and applying a lower pass voltage to a gate of one or more unselected memory cells of the string;
applying a programming voltage to a middle memory cell of a NAND architecture memory string and applying an average pass voltage to a gate of one or more unselected memory cells of the string; and
applying a programming voltage to a last memory cell of a NAND architecture memory string and applying a higher pass voltage to a gate of one or more unselected memory cells of the string.

38. The method of claim 37, wherein applying a programming voltage to a middle memory cell of a NAND architecture memory string and applying an average pass voltage to a gate of one or more unselected memory cells of the string and applying a programming voltage to a last memory cell of a NAND architecture memory string and applying a higher pass voltage to a gate of one or more unselected memory cells of the string further comprises applying a very low pass voltage to a gate of the first memory cell of the string, wherein the first memory cell is coupled to a WL0 word line that is located adjacent to a source side select gate.

39. The method of claim 38, wherein applying a very low pass voltage to a gate of the first memory cell of the string further comprises applying a very low pass voltage that is less than the lower pass voltage and greater than a maximum threshold voltage level of a programmed non-volatile memory cell.

40. The method of claim 37, wherein applying a programming voltage to a first, middle, and last memory cell of a NAND architecture memory string further comprises applying one of a channel program voltage and a channel inhibit-program voltage to a channel of the string.

41. A method of programming memory cells of a NAND architecture memory string, comprising:
applying a programming voltage to a first memory cell of a NAND architecture memory string and applying a lower pass voltage to a gate of one or more unselected memory cells of the string;
applying a programming voltage to a middle memory cell of a NAND architecture memory string, applying an average pass voltage to a gate of one or more unselected memory cells of the string, and applying a very low pass voltage to a gate of the first memory cell of the string, wherein the first memory cell is coupled to a word line that is located adjacent to a source side select gate; and
applying a programming voltage to a last memory cell of a NAND architecture memory string, applying a higher pass voltage to a gate of one or more unselected memory cells of the string, and applying a very low pass voltage to a gate of the first memory cell of the string, wherein the first memory cell is coupled to the word line that is located adjacent to a source side select gate.

42. The method of claim 41, wherein applying a much lower than the average pass voltage to a gate of the first memory cell of the string further comprises applying a pass voltage that is much lower than the lower pass voltage but is greater than a maximum threshold voltage level of a nominal programmed non-volatile memory cell.

43. The method of claim 41, wherein applying a programming voltage to a first, middle, and last memory cell of a NAND architecture memory string further comprises applying one of a channel program voltage and a channel inhibit-program voltage to a channel of the string.

44. A method of operating a NAND architecture non-volatile memory array, comprising:
selecting a memory cell in one or more NAND architecture memory cell strings for programming in a selected block of non-volatile memory cells, where the selected memory cell in each of the one or more memory cell strings is coupled to a word line;
applying a program voltage to the word line coupled to the selected memory cells; and
selecting and applying a pass voltage to one or more unselected word lines coupled to one or more unselected memory cells of the one or more memory cell strings based on the position of the selected memory cells and word line in the one or more NAND architecture memory strings, wherein a second pass voltage is applied to a first memory cell of the one of more NAND architecture memory cells if the first memory cell is not currently selected for programming, where the first memory cell is coupled to a WL0 word line that is located adjacent to a source side select gate.

45. The method of claim 44, wherein applying second pass voltage to a first memory cell of the one of more NAND architecture memory cells if the first memory cell is not currently selected for programming further comprises applying a pass voltage that is lower than the average pass voltage but is greater than a maximum threshold voltage level of a programmed non-volatile memory cell.

46. The method of claim 44, wherein selecting and applying a pass voltage to one or more unselected word lines coupled to one or more unselected memory cells of the one or more memory cell strings based on the position of the selected memory cells and word line in the one or more NAND architecture memory strings further comprises selecting and applying a lower than average pass voltage to the one or more unselected word lines when an initial word line in the one or more NAND architecture memory strings is the selected word line and selecting and applying a higher than average pass voltage to the one or more unselected word lines when a final word line in the one or more NAND architecture memory strings is the selected word line.

47. A method of programming two or more memory cells of a NAND architecture memory string, comprising:
- selecting a memory cell of a NAND architecture memory string of a non-volatile memory array to be programmed; and
- selecting and applying a pass voltage to a gate of one or more unselected memory cells of the string based on a sequence of programming the two or more memory cells in the NAND architecture memory string.

48. The method of claim 47, wherein selecting and applying a pass voltage to a gate of one or more unselected memory cells of the string based on a sequence of programming the two or more memory cells in the NAND architecture memory string further comprises selecting and applying a lower than average pass voltage to a gate of one or more unselected memory cells of the string when an initial memory cell in the NAND architecture memory string is programmed and selecting and applying a higher than average pass voltage to a gate of one or more unselected memory cells of the string when a final memory cell in the NAND architecture memory string is programmed.

49. The method of claim 47, wherein selecting and applying a pass voltage to a gate of one or more unselected memory cells of the string based on a sequence of programming the two or more memory cells in the NAND architecture memory string further comprises selecting and applying a pass voltage to a gate of one or more unselected memory cells of the string based on a number of previously programmed memory cells of the selected memory cell in the NAND architecture memory string and the probability of program disturb in an erase block containing the NAND architecture memory string for the selected pass voltage and selected memory cell position being programmed.

50. The method of claim 47, wherein selecting and applying a pass voltage to a gate of one or more unselected memory cells of the string based on a sequence of programming the two or more memory cells in the NAND architecture memory string further comprises selecting and applying two or more pass voltages to different gates of the one or more unselected memory cells of the string.

51. The method of claim 47, further comprising selecting a second pass voltage to apply to one or more second unselected memory cells of the string based on one of a physical or electrical characteristic of the one or more second unselected memory cells, and the position of the one or more second unselected memory cells in the NAND architecture memory string.

* * * * *

UNITED STATES PATENT AND TRADEMARK OFFICE
CERTIFICATE OF CORRECTION

PATENT NO.        : 7,292,476 B2
APPLICATION NO.   : 11/215933
DATED             : November 6, 2007
INVENTOR(S)       : Goda et al.

It is certified that error appears in the above-identified patent and that said Letters Patent is hereby corrected as shown below:

In column 22, line 26, in Claim 31, after "applying" insert -- a --.

In column 23, line 49, in Claim 38, delete "WLO" and insert -- WL0 --, therefor.

In column 24, line 43, in Claim 44, after "one" delete "of" and insert -- or --, therefor.

In column 24, line 49, in Claim 45, after "one" delete "of" and insert -- or --, therefor.

Signed and Sealed this

Eighteenth Day of March, 2008

JON W. DUDAS
*Director of the United States Patent and Trademark Office*